United States Patent [19]

Haukness

[11] Patent Number: 5,926,422
[45] Date of Patent: Jul. 20, 1999

[54] INTEGRATED CIRCUIT MEMORY DEVICE HAVING CURRENT-MODE DATA COMPRESSION TEST MODE

[75] Inventor: Brent S. Haukness, Garland, Tex.

[73] Assignee: Texas Instruments Incorporated, Dallas, Tex.

[21] Appl. No.: 08/942,930

[22] Filed: Oct. 2, 1997

[51] Int. Cl.$^6$ ...................................................... G11C 7/00
[52] U.S. Cl. .................... 365/201; 365/185.21; 365/200; 365/205; 365/230.03
[58] Field of Search ............................... 365/201, 185.09, 365/185.21, 200, 205, 230.03

[56] References Cited

U.S. PATENT DOCUMENTS

| | | | |
|---|---|---|---|
| 5,519,712 | 5/1996 | Shu et al. | 365/201 |
| 5,539,694 | 7/1996 | Rouy | 365/201 |
| 5,546,537 | 8/1996 | McClure | 365/201 |
| 5,566,113 | 10/1996 | Saito et al. | 365/201 |
| 5,568,434 | 10/1996 | Jeon | 365/201 |
| 5,574,693 | 11/1996 | Inui et al. | 365/201 |
| 5,612,919 | 3/1997 | Arimoto | 365/201 |
| 5,629,943 | 5/1997 | McClure | 365/201 |
| 5,668,764 | 9/1997 | Surlekar | 365/201 |
| 5,677,881 | 10/1997 | Seo et al. | 365/201 |
| 5,717,643 | 2/1998 | Iwanami et al. | 365/201 |

OTHER PUBLICATIONS

Masao Taguchi, Hiroyoshi Tomita, Toshiya Uchida, Yasuhiro Ohnishi, Kimiaki Sato, Taiji Ema, Masaaki Hihashitani, Takashi Yabu; A 40–ns 64–MB DRAM with 64–b Parallel Data Bus Architecture; IEEE Journal of Solid–State circuits, vol. 26, No. 11, Nov. 1991.

*Primary Examiner*—David Nelms
*Assistant Examiner*—Tuan T. Nguyen
*Attorney, Agent, or Firm*—Robby T. Holland; Carlton H. Hoel; Richard L. Donaldson

[57] ABSTRACT

An integrated circuit memory device (10) has a current-mode data compression test mode. The memory device (10) includes a memory array having a plurality of sub-arrays (12) of memory cells. The memory cells are selected for read operations by Y-select lines (18) and word lines (16). Selected memory cells are coupled to main amplifier circuits (28) via bit lines (14), sense amplifiers (20), sub-input/output lines (22), sub-amplifier circuits (24), and main input/output lines (26). Each main amplifier circuit (28) is operable, during a normal read operation, to provide a data output (DOUT) representing a data state of a selected memory cell. During a test mode read operation, each main amplifier circuit (28) is operable to provide a data output (DOUT) representing a data state of a plurality of selected memory cells if the plurality of selected memory cells have the same data state, and to provide an error signal (ERROR) if the plurality of selected memory cells have different data states. The test mode read operation is characterized by activating a Y-select line (18) and a plurality of word lines (16) to select a plurality of memory cells that are coupled to different sub-amplifier circuits (24) that feed the same main amplifier circuit (28).

13 Claims, 10 Drawing Sheets

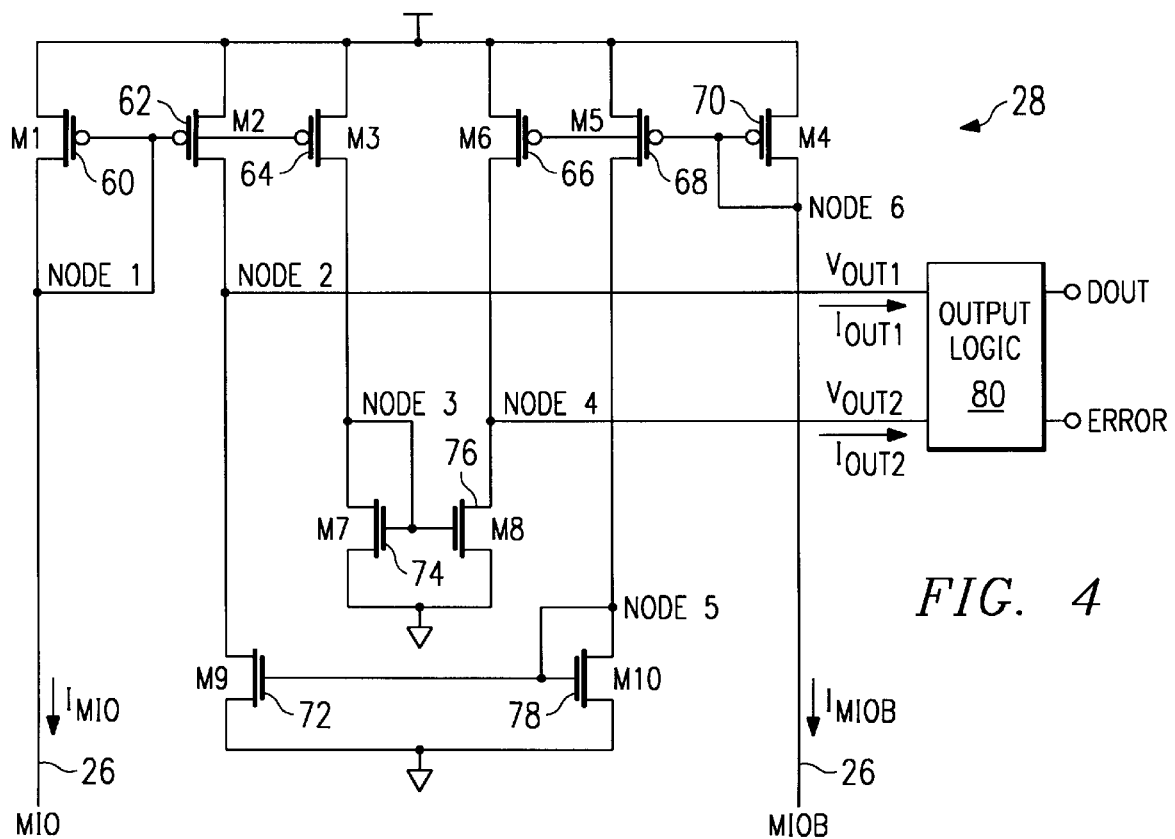
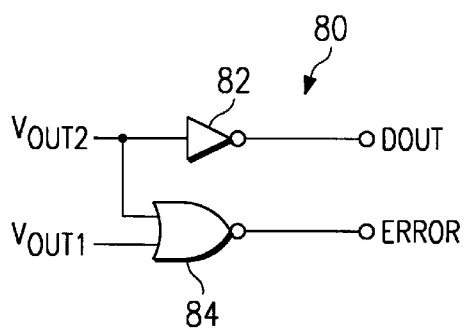
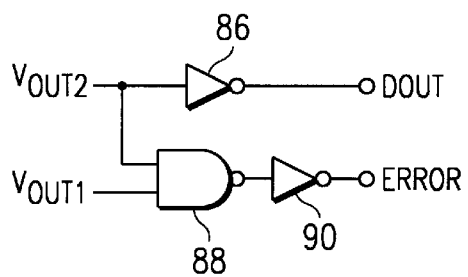
FIG. 4
FIG. 5A                FIG. 5B 5,926,422

INTEGRATED CIRCUIT MEMORY DEVICE HAVING CURRENT-MODE DATA COMPRESSION TEST MODE

This is a Non Provisional application filed under 35 USC 119(e) and claims priority of prior provisional Ser. No. 06/029,419 of inventor Houkness filed Oct. 31, 1996.

TECHNICAL FIELD OF THE INVENTION

This invention relates in general to the field of integrated circuit memory devices, and more particularly to an integrated circuit memory device having a current-mode data compression test mode.

BACKGROUND OF THE INVENTION

Integrated circuit memory devices generally include memory arrays containing a large number of memory cells for storing data. It is important in producing such memory devices to test writing data to and reading data from the memory cells to determine whether or not there are defective memory cells in the memory device. Conventional processes for testing the memory cells of an integrated circuit memory device can be time consuming because of the vast number of memory cells that need to be tested. Such conventional testing processes include writing data to the memory cells, reading data from the memory cells and checking whether the data read is the same as the data written. In general, one row of memory cells for the memory array can be tested by each read. Because of the time required, it is desirable to increase the speed with which memory cells can be tested during test mode. An architecture for increasing this speed is disclosed by U.S. Pat. No. 5,305,266, issued to Rountree and entitled "High Speed Parallel Test Architecture".

SUMMARY OF THE INVENTION

In accordance with the present invention, an integrated circuit memory device having a current-mode data compression test mode is provided that eliminates or reduces problems and disadvantages of prior integrated circuit memory devices.

According to one aspect of the present invention, an integrated circuit memory device is provided that has a current-mode data compression test mode. The memory device includes a memory array having a plurality of sub-arrays of memory cells. The memory cells are selected for read operations by Y-select lines and word lines. Selected memory cells are coupled to main amplifier circuits via bit lines, sense amplifiers, sub-input/output lines, sub-amplifier circuits, and main input/output lines. Each main amplifier circuit is operable, during a normal read operation, to provide a data output representing a data state of a selected memory cell. During a test mode read operation, each main amplifier circuit is operable to provide a data output representing a data state of a plurality of selected memory cells if the plurality of selected memory cells have the same data state, and to provide an error signal if the plurality of selected memory cells have different data states. The test mode read operation is characterized by activating a Y-select line and a plurality of word lines to select a plurality of memory cells that are coupled to different sub-amplifier circuits that feed the same main amplifier circuit.

According to another aspect of the present invention, a method is provided for testing an integrated circuit memory device. A Y-select line and a plurality of word lines are activated to select a plurality of memory cells. The plurality of word lines are activated such that the selected memory cells are coupled to different sub-amplifier circuits that feed the same main amplifier circuit. From each main amplifier circuit, a data output representing a data state of the selected memory cells is produced if the selected memory cells have the same data state, and an error signal is produced if the selected memory cells have different data states. The activating and producing are repeated until all memory cells in the memory array of the memory device have been tested.

A technical advantage of the present inventions an increase in the speed with which memory cells in a memory device can be tested by a factor of two. This increase can be realized without requiring changes to the design of the memory array in the memory device.

Another technical advantage of the present invention is a test mode in which two rows of a memory array are simultaneously activated to place data from both rows onto common input/output lines. A three-state current-mode signal is then generated on the input/output lines that contains a data state which can be analyzed to determine whether or not the data in both rows was accurate or inaccurate.

BRIEF DESCRIPTION OF THE DRAWINGS

A more complete understanding of the present invention and advantages thereof may be acquired by referring to the following description taken in conjunction with the accompanying drawings in which like reference numbers indicate like features, and wherein:

FIG. 4 is a circuit diagram of one embodiment of a current mirror main amplifier circuit;

FIGS. 5A and 5B are circuit diagrams of embodiments of main amplifier output logic;

DETAILED DESCRIPTION OF THE INVENTION

Figure 1:
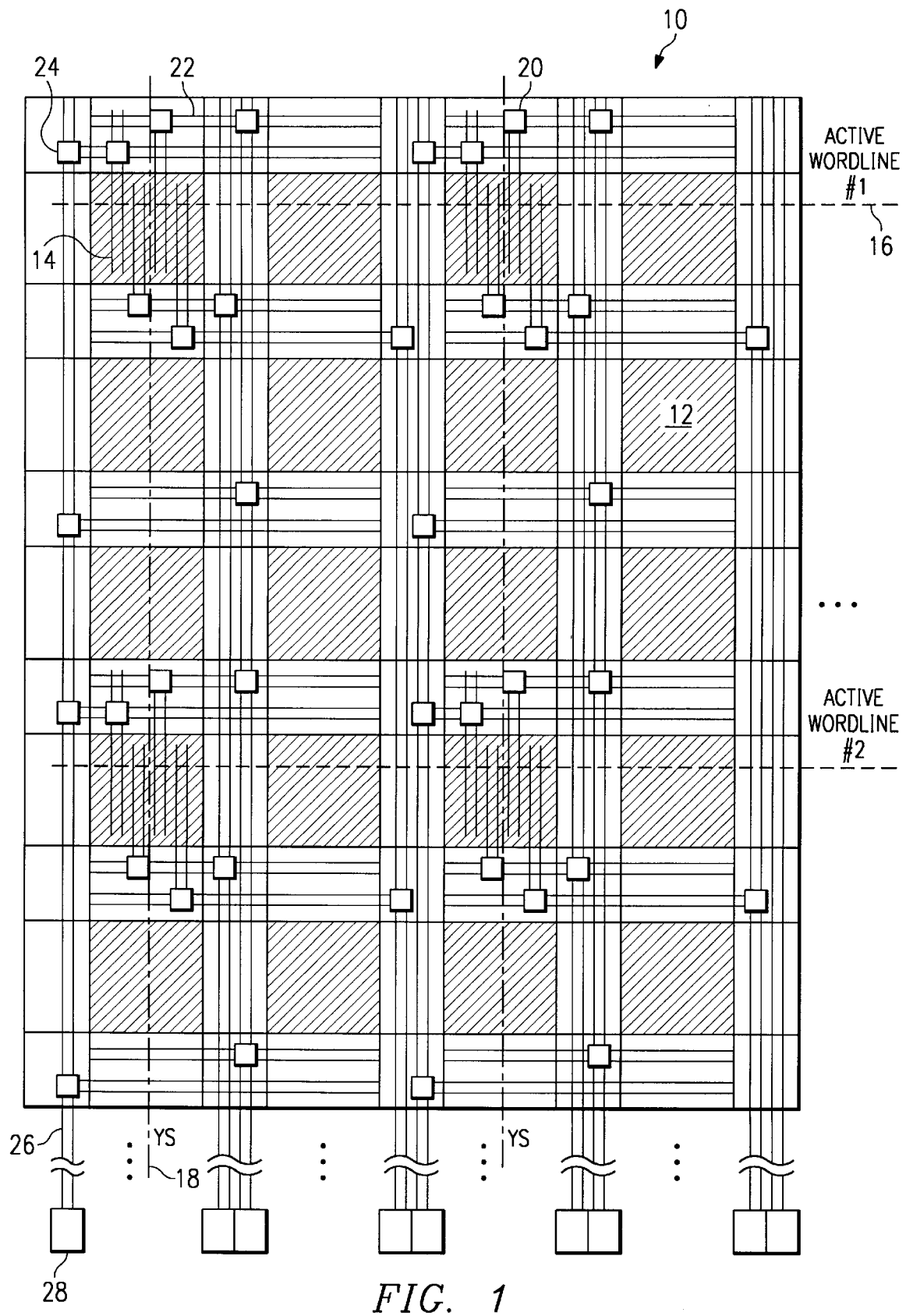
FIG. 1 is a block diagram of one embodiment of an integrated circuit memory device having a current-mode data compression test mode.

FIG. 1 is a block diagram of one embodiment of an integrated circuit memory device, indicated generally at 10, having a current-mode data compression test mode. Specifically, the described embodiment is a dynamic random access memory (DRAM) device. FIG. 1 shows the input/output (I/O) data path for memory device 10. Memory device 10 includes a number of memory sub-arrays 12 which each contain a plurality of memory cells. The memory cells within each sub-array 12 are connected to bit lines 14 and word lines 16. As shown in FIG. 1, during a current-mode data compression test mode, two word lines 16 are active (e.g., ACTIVE WORDLINE#1 and ACTIVE WORDLINE#2). Memory device 10 includes a plurality of Y-select (YS) lines 18 which are used to select a particular column within memory device 10. Bit lines 14 are, in turn, connected to sense amplifiers 20 which are connected to sub-input/output (SIO) lines 22. SIO lines 22 feed sub-amplifiers 24 which connect to main input/output (MIO) lines 26, as shown. MIO lines 26 connect to main amplifiers 28 which can provide data output for memory device 10. In the I/O scheme of the embodiment of FIG. 1, SIO lines 22 run through the banks of sense amplifiers 20 and connect to MIO lines 26 through respective sub-amplifier circuits 24. MIO lines 26 are shared by many sense amplifiers 20, thus many sets of SIO lines 22 connect to each set of MIO lines 26.

In a normal read operation, one row of memory cells in memory device 10 is activated by activating a word line 16 (e.g., WORDLINE#1). Data is then sensed in sense amplifiers 20 for that row. To read data from memory device 10, a read enable (RE) signal can be asserted to activate sub-amplifier circuits 24 for the active sense amplifiers 20. Then, a YS line 18 for a particular column address can be asserted to connect selected sense amplifiers 20 to a set of SIO lines 22. Data is then transferred from sense amplifiers 20 to SIO lines 22 and onto MIO lines 26 through sub-amplifier circuits 24. Data on MIO lines 26 is, in turn, sensed by main amplifiers 28 located at the edge of the memory array of memory device 10. In a normal write operation, data can be asserted on MIO lines 26. A write enable (WE) signal can then be asserted to connect MIO lines 26 directly to SIO lines 22 at sub-amplifiers 24. A YS line 18 can then be asserted to connect data on SIO lines 22 to sense amplifiers 20. The following discussion refers to just one of the bits of data of a single activated YS line 18.

In current-mode data compression test mode, a second word line (e.g., WORDLINE #2) is asserted such that two sets of sense amplifiers 20 are activated at the same time. The only restriction on this second word line is that the row address should not be in an adjacent sub-array 12 that shares sense amplifiers 20 and sub-amplifier circuits 24. To perform a read operation in this test mode, RE signals are asserted for both active banks of sense amplifier 20 which connects two sub-amplifier circuits 24 to each pair of MIO lines 26. YS lines 18 are then asserted such that data from two banks of sense amplifiers 20 is connected to corresponding SIO lines 22 and to two active sub-amplifier circuits 24. In this manner, sub-amplifier circuits 24 have characteristics such a three-state signal is created on MIO lines 26 depending on the data states on the active SIO lines 22. The signal on MIO lines 26 takes one state if the data on both active pairs of SIO lines 22 is "zero", a second state if the data on both pairs of SIO lines 22 is "one", and a third state if there is opposite data on both pairs of SIO line 22. Main amplifiers 28 are designed to read this three-state signal during the current-mode data compression test mode and provide an output indicating which state is present and whether or not there is an error. By testing more than one row at a time in memory device 10, the current-mode data compression test mode reduces the time required to test the memory cells of memory device 10.

Figure 2:
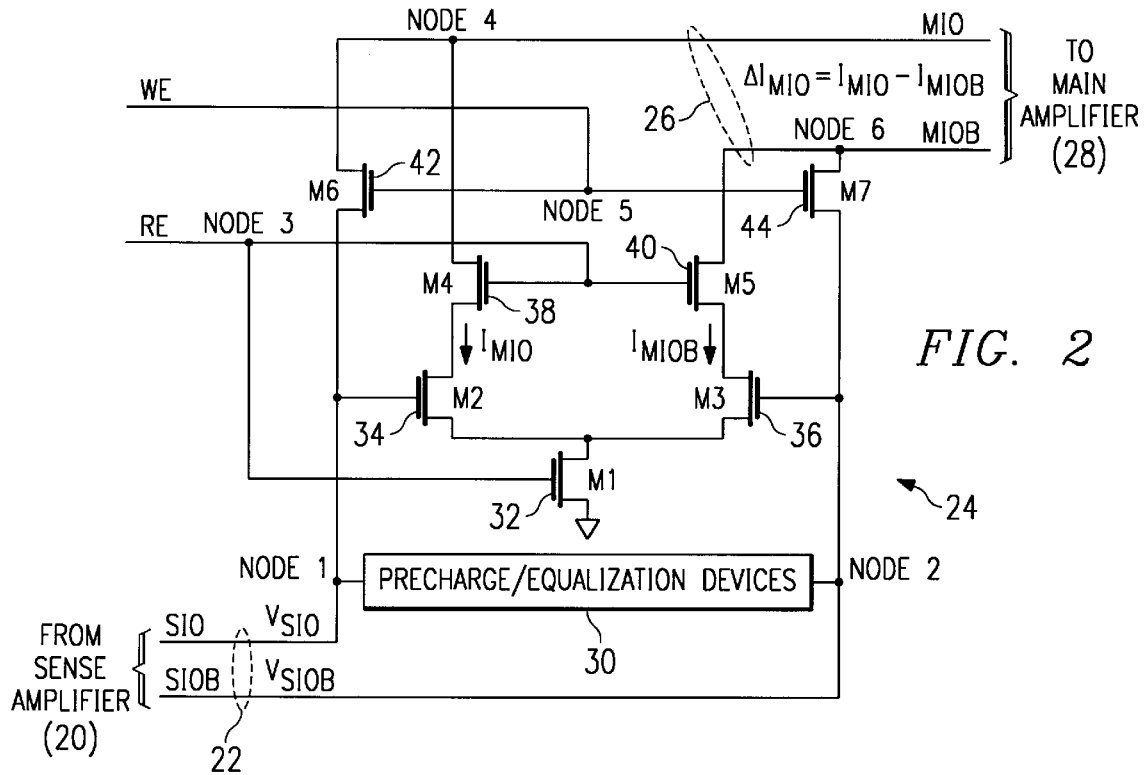
FIG. 2 is a circuit diagram of one embodiment of a sub-amplifier circuit.

FIG. 2 is a circuit diagram of one embodiment of a sub-amplifier circuit 24 of memory device 10. As shown, sub-amplifier circuit 24 receives a pair of SIO lines 22 from a sense amplifier 20. SIO lines 22 include pair of lines, SIO and SIOB, which have voltage levels VSIO and VSIOB, respectively. As shown in FIG. 2, the SIO line is connected to a first node, NODE 1, and the SIOB line is connected to a second node, NODE 2. Precharge/equalization devices 30 are connected between NODE 1 and NODE 2. A plurality of N-channel transistors, 32, 34, 36, 38, 40, 42 and 44 are connected, as shown. N-channel transistors 32, 38 and 40 are coupled to a third node, NODE 3, and receive the read enable (RE) signal. N-channel transistors 42 and 44 are coupled to a fifth node, NODE 5, and receive a write enable (WE) signal. The output of sub-amplifier circuit 24 to main amplifier 28 is provided by MIO lines 26. Similar to SIO lines 22, MIO lines 26 include an MIO and an MIOB line. In general, sub-amplifier circuit 24 of FIG. 2 provides a semi-direct sense circuit typically used in DRAM memory devices.

During a read operation, RE is asserted high which turns on N-channel transistors 32, 38 and 40. The SIO and SIOB lines are precharged high by precharge/equalization devices 30 so that N-channel transistors 34 and 36 are turned on. This allows a current $I_o$ to flow through both MIO and MIOB. When a YS line is asserted, either SIO or SIOB will be pulled low depending on the data state in the sense amp, and either N-channel transistor 34 or N-channel transistor 36 will be turned off. This causes either IMIO or IMIOB to go to zero. Therefore, a differential current, IMIO minus IMIOB, exists on MIO lines 26 which starts at zero and becomes plus or minus $I_o$ once SIO lines 22 have completely split. A main amplifier circuit 28 located at the edge of memory device 10 can then detect this current-mode signal. This sub-amplifier circuit operation is summarized in the table below.

TABLE 1

Sub-amplifier Circuit Operation

| Data in SA | V SIO | V SIOB | I MIO | I MIOB | D IMIO |
|---|---|---|---|---|---|
| 1 | H | L | $I_o$ | 0 | $+I_o$ |
| 0 | L | H | 0 | $I_o$ | $-I_o$ |

To write data back to SIO lines 22, data is driven on to MIO lines 26, and the WE signal is asserted high. This connects MIO lines 26 directly to SIO lines 22 through N-channel transistors 42 and 44. A YS line 18 can then be asserted such that data is transferred from SIO lines 22 into sense amplifier 20.

Figure 3:
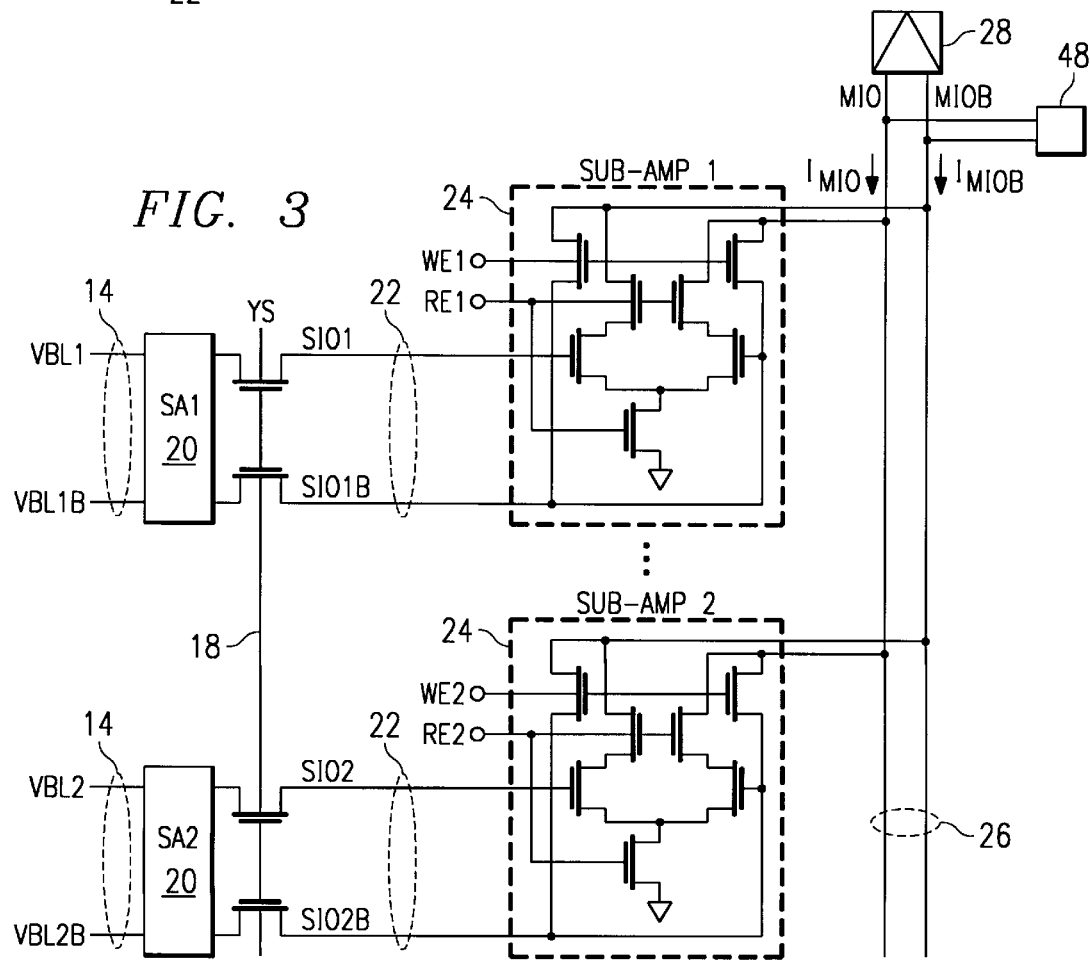
FIG. 3 is a circuit diagram of one embodiment of sub-amplifier circuit operation during current-mode data compression test mode.

FIG. 3 is a circuit diagram of one embodiment of sub-amplifier circuit 24 operation during current-mode data compression test mode. As shown, two sense amplifiers 20 receive two pairs of bit lines 14 having voltage levels VBL1, VBL1 B, VBL2, VBL2B. The two sense amplifiers 20 are selected by a YS line 18 and feed two sub-amplifier circuits 24 with SIO lines 22. As discussed above, each sub-amplifier 24 receives a write enable (WE1 and WE2) signal and a read enable (RE1 and RE2) signal. Sub-amplifier circuits 24 are connected to MIO lines 26 which feed a main amplifier circuit 28. In addition, an MIO write driver circuit 48 is connected to MIO lines 26. To write data in test mode with two word lines 16 activated, both the WE1 and WE2 signals are asserted. This connects MIO lines 26 directly to SIO lines 22 (SIO1/SIO1B and SIO2/SIO2B). YS line 18 is also asserted high, and data is transferred from MIO lines 26 to SIO lines 22 and to both sense amplifiers 20. To read data in the test mode, the RE1 and RE2 signals are both asserted so that sub-amplifier circuits 24 are both connected to MIO lines 26. At the start of the read operation, both pairs of SIO lines 22 are precharged high so that a current equal to $2I_0$ flows through MIO lines 26. YS line 18 is then asserted, and data from the first sense amplifier 20 (SA1) is transferred to SIO1/SIO1B, and data from the second sense amplifier 20 (SA2) is transferred to SIO2/SIO2B. The final current in MIO lines 26 then depends on the data states in the two sense amplifiers 20 as shown in the table below.

TABLE 2

Sub-Amplifier Circuit Operation during Test Mode

| Data in SA1 | Data in SA2 | V SIO1 | V SIOB1 | V SIO2 | V SIOB2 | I MIO | I MIOB | DI MIO |
|---|---|---|---|---|---|---|---|---|
| 1 | 1 | H | L | H | L | $2I_0$ | 0 | $+2I_0$ |
| 0 | 0 | L | H | L | H | 0 | $2_{I0}$ | $-2I_0$ |
| 1 | 0 | H | L | L | H | $I_0$ | $I_0$ | 0 |
| 0 | 1 | L | H | H | L | $I_0$ | $I_0$ | 0 |

As can be seen, If both sense amplifiers 20 contain the same data state, then the final differential MIO current will be plus or minus $2I_0$. If the two sense amplifiers 20 have opposite data, however, a current of $I_0$ will flow in both MIO and MIOB, and the differential MIO current will be zero. By using this scheme, the same data can be written to both selected sense amplifiers 20 and then read back and checked to see that the stored data is the same. If not, then one of the memory cells storing the data is defective. This test mode allows a two-fold reduction in the number of row addresses that need to be asserted in order to test the integrated circuit memory device.

FIG. 4 is a circuit diagram of one embodiment of a current mirror main amplifier circuit, indicated generally at 28. The configuration of main amplifier circuit 28 of FIG. 4 is essentially the same as a current sensing data bus amplifier presented by FUJITSU in an article entitled "A 40-NS 64-MB DRAM with 64-B Parallel Data Bus Architecture", published in the IEEE Journal of Solid-State Circuits, Vol. 26, No. 11, November, 1991, page 1493–97. However, in contrast to the amplifier disclosed in that article, main amplifier 28 of FIG. 4 is used to detect an error condition if the currents IMIO and IMIOB on MIO lines 26 are approximately equal. As shown in FIG. 4, main amplifier circuit 28 receives MIO lines 26 which carry currents IMIO and IMIOB. A plurality of P-channel transistors 60, 62, 64, 66, 68 and 70 are connected between MIO lines 26, as shown, and create a pair of current mirror circuits. A plurality of N-channel transistors 72, 74, 76 and 78 are connected to the P-channel transistors, as shown, to couple together the current mirror circuits formed by the P-channel transistors.

In the illustrated embodiment, the P-channel and N-channel transistors of main amplifier circuit 28 are constructed such that the currents IOUT1 and IOUT2 are the same if the currents IMIO and IMIOB are the same, and the currents IOUT1 and IOUT2 are of opposite polarity if there is a difference between IMIO and IMIOB. The P-channel transistors are selected such that the ratios of the widths of the transistors, which form the current mirror factor, m1, for the P-channel transistors, is as follows:

$$m1 = W2/W1 = W3/W1 = W5/W4 = W6/W4$$

The N-channel transistors are selected such that the ratios of the widths of the transistors, which form the current mirror factor, m2, for the N-channel transistors, is as follows:

$$m2 = W8/W7 = W9/W10$$

With the current mirror factors set up in this manner, the P-channel and N-channel transistors operate to produce the currents IOUT1 and IOUT2 according to the following:

$$IOUT1 = m1(IMIO - m2*IMIOB)$$

$$IOUT2 = m1(IMIOB - m2*IMIO).$$

Main amplifier circuit 28 then provides outputs VOUT1/IOUT1 from NODE 2 and VOUT2/IOUT2 from NODE 4 to output logic 80. Output logic 80 in turn provides an output data signal, DOUT and an error signal, ERROR. Main amplifier circuit 28 operates to produce VOUT1/IOUT1 and VOUT2/IOUT2 based upon IMIO and IMIOB on MIO lines 26.

The following table shows the output currents IOUT1 and IOUT2 based upon what data is in the sense amplifiers 20.

TABLE 3

Main Amplifier Circuit Operation

| Data in SA1 | Data in SA2 | I MIO | I MIOB | DI MIO | IOUT1 | IOUT2 |
|---|---|---|---|---|---|---|
| normal operation | | | | | | |
| 1 | x | $I_0$ | 0 | $I_0$ | $m1I_0$ | $-m1m2I_0$ |
| 0 | x | 0 | $I_0$ | $I_0$ | $-m1m2I_0$ | $m1I_0$ |
| test mode operation | | | | | | |
| 1 | 1 | $2I_0$ | 0 | $+2I_0$ | $2m1I_0$ | $-2m1m2I_0$ |
| 0 | 0 | 0 | $2_{I0}$ | $-2I_0$ | $-2m1m2I_0$ | $2m1I_0$ |
| 1 | 0 | $I_0$ | $I_0$ | 0 | $m1(1-m2)I_0$ | $m1(1-m2)I_0$ |
| 0 | 1 | $I_0$ | $I_0$ | 0 | $m1(1-m2)I_0$ | $m1(1-m2)I_0$ |

It should be noted that for test mode operation where the same data is in both activated sense amplifiers and for normal operation, there will be an opposite current flow on the two outputs. For test mode operation where different data is in the two sense amplifiers (i.e., an error condition), there will be the same current flow in the two outputs which will be either positive or negative depending on the relative values of m1 and m2. Assuming that onlycapacitive loads are attached to the main amplifier output nodes, NODE 2 and NODE 4, then the following relationships will occur. If IOUT1 is positive, then VOUT1 will swing to a high voltage, while if IOUT1 is negative, then VOUT1 will swing to a low voltage. The same relationship applies for IOUT2 and VOUT2. By using appropriate logic in output logic 80, main amplifier circuit 28 can therefore be used to detect an error condition during test mode as well as to function normally when not in test mode.

FIGS. 5A and 5B are circuit diagrams of embodiments of main amplifier output logic 80. The embodiment of FIG. 5A is appropriate where the value of m2 is greater than 1. When m2 is greater than 1, the value of $m1(1-m2)I_0$ will be negative, and VOUT1 and VOUT2 will both be logic lows when there is an error condition during test mode. In the embodiment of FIG. 5A, VOUT2 is connected to the input of an inverter 82 which provides the data output, DOUT. VOUT2 and VOUT1 are both fed to a NOR gate 84 which provides the error signal, ERROR. In this case, where m2 is greater than 1, the output currents for an error condition will produce logic lows at VOUT1 and VOUT2. Thus, the outputs DOUT and ERROR will be as shown in the following table.

TABLE 4

Output Logic for m2 > 1

| Data in SA1 | Data in SA2 | IOUT1 | IOUT2 | VOUT1 | VOUT2 | DOUT | ERROR |
|---|---|---|---|---|---|---|---|
| normal operation | | | | | | | |
| 1 | x | (+) | (−) | H | L | H | x |
| 0 | x | (−) | (+) | L | H | L | x |
| test mode operation | | | | | | | |
| 1 | 1 | (+) | (−) | H | L | H | L |
| 0 | 0 | (−) | (+) | L | H | L | L |
| 1 | 0 | (−) | (−) | L | L | x | H |
| 0 | 1 | (−) | (−) | L | L | x | H |

As can be seen, DOUT provides the appropriate data during normal operation and ERROR is a "don't care". During test mode operation where there is no error, DOUT again provides the appropriate data, and ERROR is low. However, where there is an error condition and the data in the two sense amplifiers is different, ERROR signals this condition by a logic HIGH.

The embodiment of FIG. 5B is appropriate where the value of m2 is less than 1. When m2 is less than 1, the value of m1 (1−m2)I$_0$ will be positive, and VOUT1 and VOUT2 will both be logic highs when there is an error condition during test mode. In FIG. 5B, VOUT2 is connected to the input of an inverter 86 which provides the data output, DOUT. VOUT2 and VOUT1 are provided as inputs to a NAND gate 88 which provides its output to an inverter 90. The output of inverter 90 provides the error signal, ERROR. In this case, the output currents for the error condition will both be positive and produce logic highs for VOUT1 and VOUT2. The outputs DOUT and ERROR will be as shown in the following table.

TABLE 5

Output Logic for m2 < 1

| Data in SA1 | Data in SA2 | IOUT1 | IOUT2 | VOUT1 | VOUT2 | DOUT | ERROR |
|---|---|---|---|---|---|---|---|
| normal operation | | | | | | | |
| 1 | x | (+) | (−) | H | L | H | x |
| 0 | x | (−) | (+) | L | H | L | x |
| test mode operation | | | | | | | |
| 1 | 1 | (+) | (−) | H | L | H | L |
| 0 | 0 | (−) | (+) | L | H | L | L |
| 1 | 0 | (+) | (+) | H | H | x | H |
| 0 | 1 | (+) | (+) | H | H | x | H |

As can be seen, DOUT provides the appropriate data during normal operation and ERROR is a "don't care". During test mode operation where there is no error, DOUT again provides the appropriate data, and ERROR is low. Where there is an error condition and the data in the two sense amplifiers is different, ERROR signals this condition by a logic HIGH.

Thus, during normal operation of either output logic circuit 80, the error signal, ERROR, is ignored and the data on the differential MIO lines is converted to a single-ended data signal, DOUT. For test mode operation, the error signal, ERROR, will be high if an error condition exists in which opposite data is read from the two active sense amplifiers. If the error signal, ERROR, is low, then the two active sense amplifiers contain the same data state, and the DOUT signal takes the value of the data state read. This value, of course, should be compared to the expected data to ensure that both sense amplifiers do not contain incorrect data.

The present invention allows integrated circuit memory device to be tested more quickly by testing memory cells in multiple rows at the same time. The testing of the memory device is an important and essential part of the manufacturing process. According to the present invention, a Y-select line and a plurality of word lines are activated to select a plurality of memory cells such that the selected memory cells are coupled to different sub-amplifier circuits that feed the same main amplifier circuit. Each main amplifier circuit then produces a data output representing a data state of the selected memory cells if the selected memory cells have the same data state. Each main amplifier circuit produces an error signal if the selected memory cells have different data states. The activating of Y-select lines and word lines and the producing of data outputs and error signals is repeated until all memory cells in the memory array of the memory device have been tested. Memory devices that pass testing can then be separated from failed devices in order to continue the manufacturing process.

Figure 6:
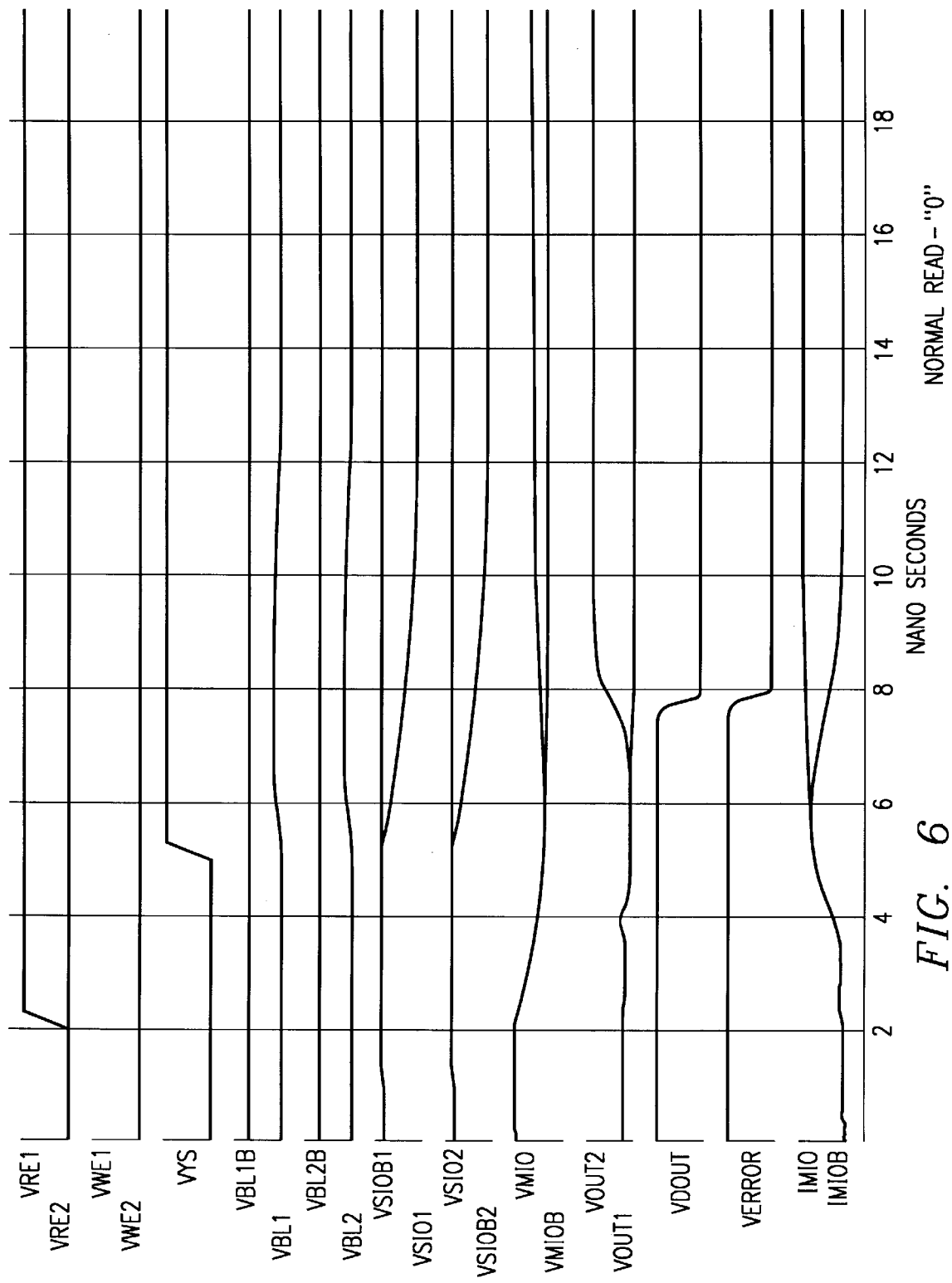
FIG. 6 is a timing diagram of one embodiment of read "zero" operation.
Figure 7:
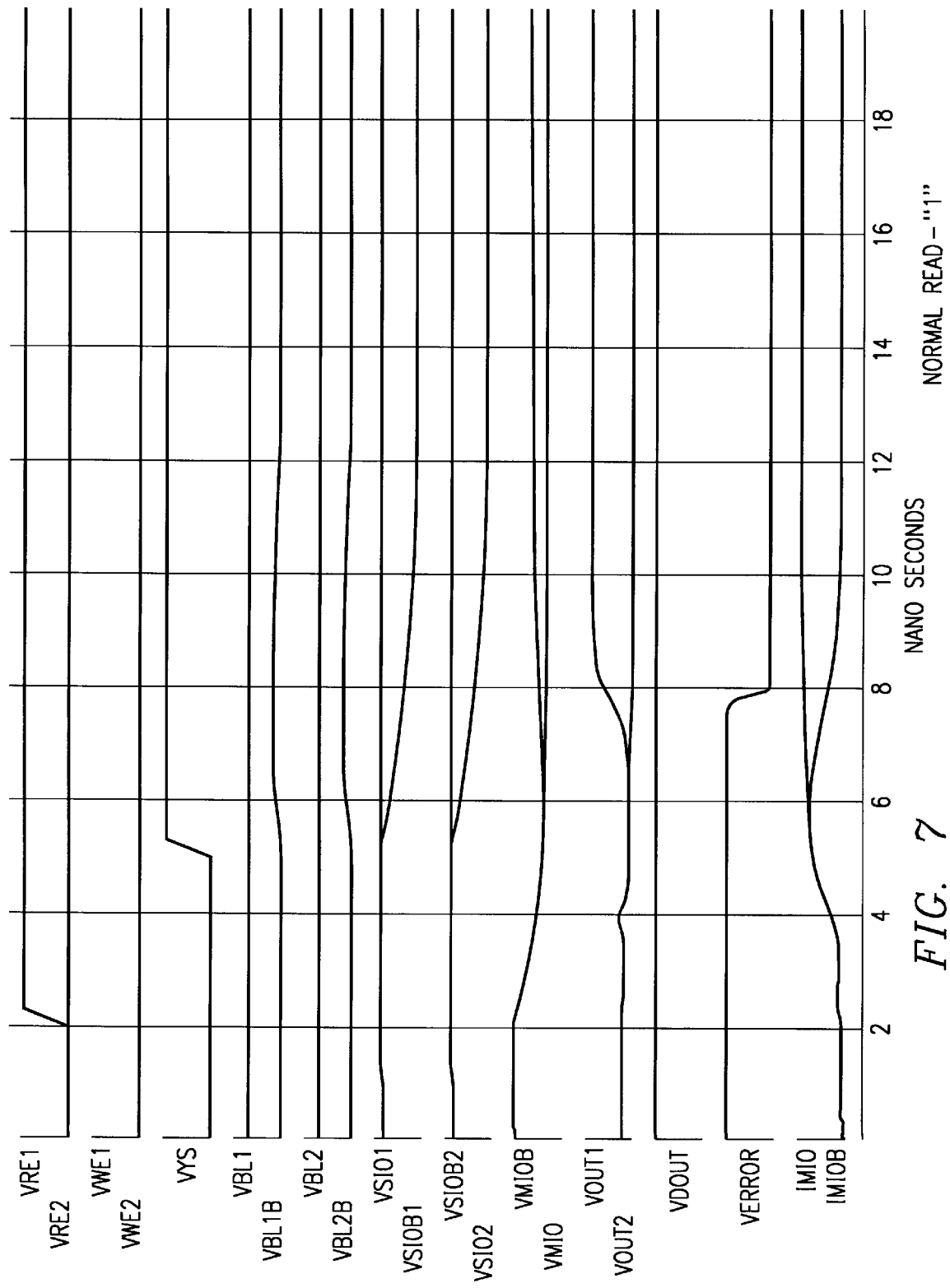
FIG. 7 is a timing diagram of one embodiment of read "one" operation.

FIGS. 6–12 show timing diagrams for various signals for the behavior of memory device 10 shown and described with respect to FIGS. 1–5B. FIG. 6 is a timing diagram of one embodiment of read "zero" operation. This timing diagram shows the read enable signals, VRE1 and VRE2, for the two sense amplifiers (of course, only one sense amplifier is used during normal reads), and the write enable signals, VWE1 and VWE2, for those sense amplifiers. FIG. 6 shows the signal on the YS line, VYS, for the memory cell being read. FIG. 6 further shows: the signals on the bit lines, VBL1, VBL1B, VBL2, and VBL2B, which are sensed by the sense amplifiers; the signals on the SIO lines, VSIO1, VSIOB1, VSIO2, and VSIOB2, which are driven by the sense amplifiers; and the signals on the MIO lines, VMIO and VMIOB. FIG. 6 also shows the main amplifier circuit output signals, VMIO and VMIOB, as well as the data out signal, VDOUT, and the error signal, VERROR. Lastly, FIG. 6 shows the current output signals if the main amplifier circuit, IMIO and IMIOB. AS can be seen, FIG. 6 shows these signals during read of a "zero" from a memory cell sensed by the first sense amplifier. FIG. 7 is a timing diagram of one embodiment of read "one" operation. FIG. 7 shows the same signals as FIG. 6 but with a "one" being read from the first sense amplifier.

Figure 8:
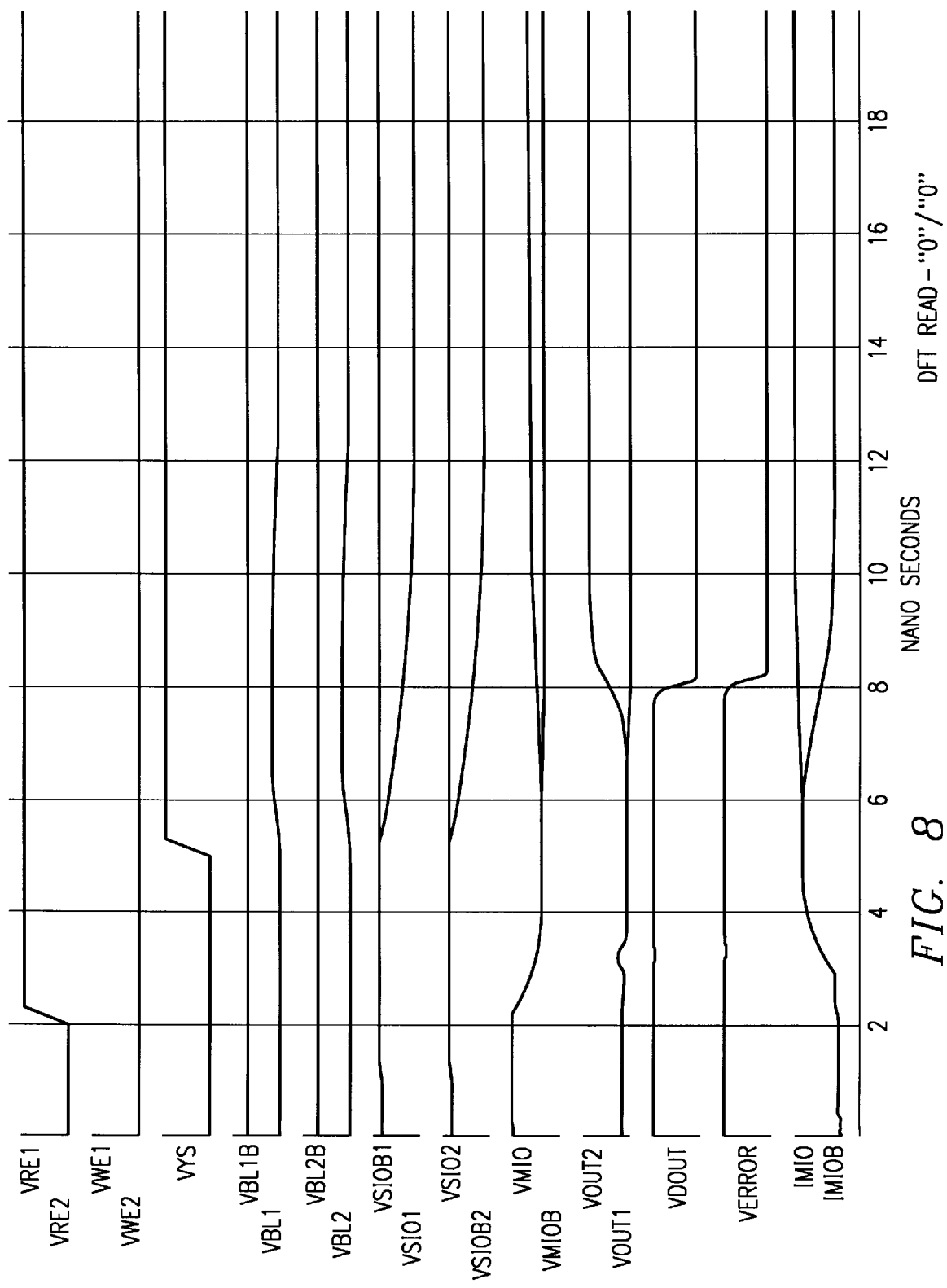
FIG. 8 is a timing diagram of one embodiment of current-mode data compression test mode operation with "zero" in both sense amplifiers.
Figure 9:
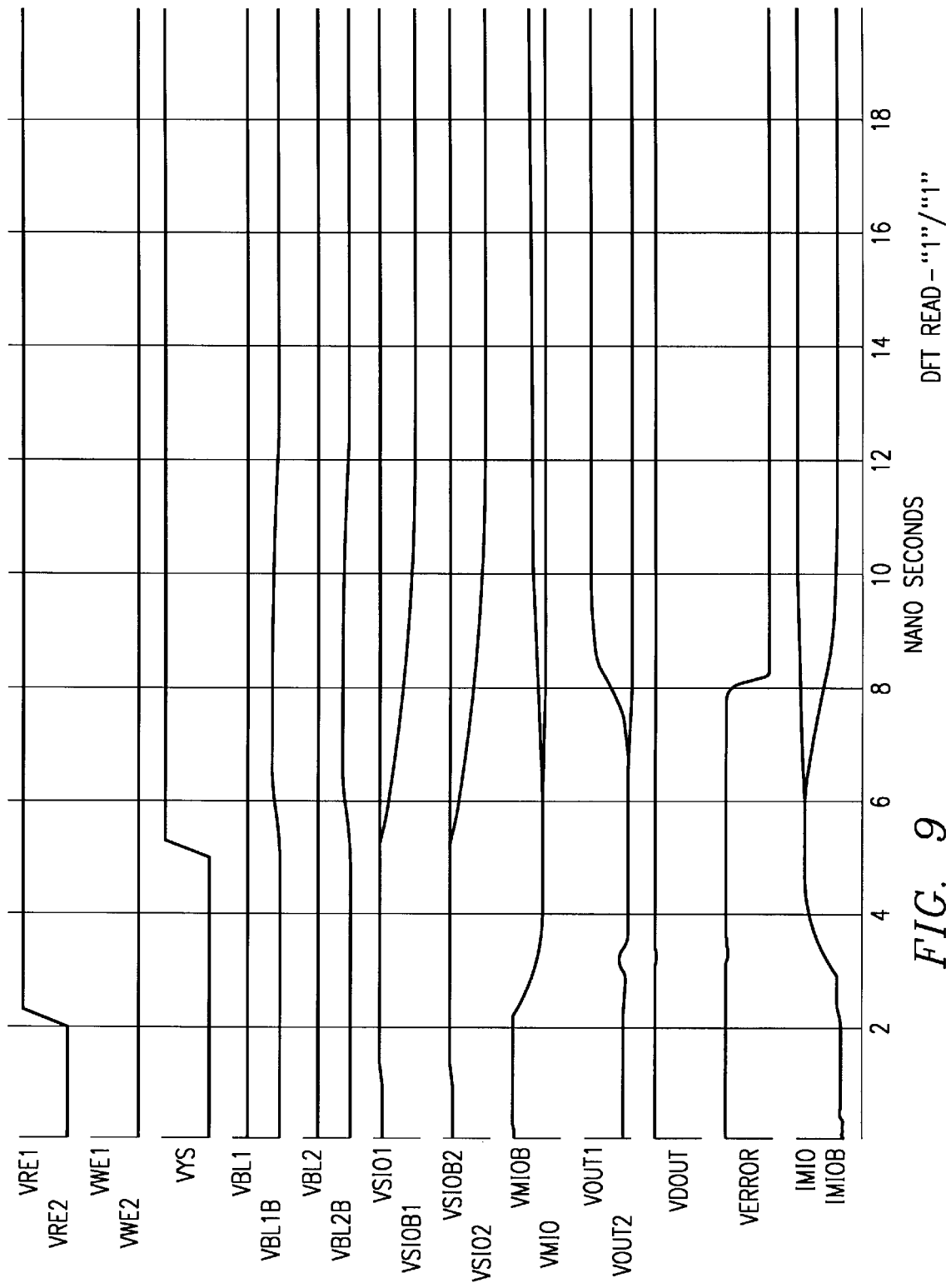
FIG. 9 is a timing diagram of one embodiment of current-mode data compression test mode operation with a "one" in both sense amplifiers.

FIG. 8 is a timing diagram of one embodiment of current-mode data compression test mode operation with "zero" in both sense amplifiers, and FIG. 9 is a timing diagram of one embodiment of current-mode data compression test mode operation with a "one" in both sense amplifiers. FIGS. 8 and 9 show the same set of signals discussed above in the situation where the two memory cells being tested hold the same data states as expected.

Figure 10:
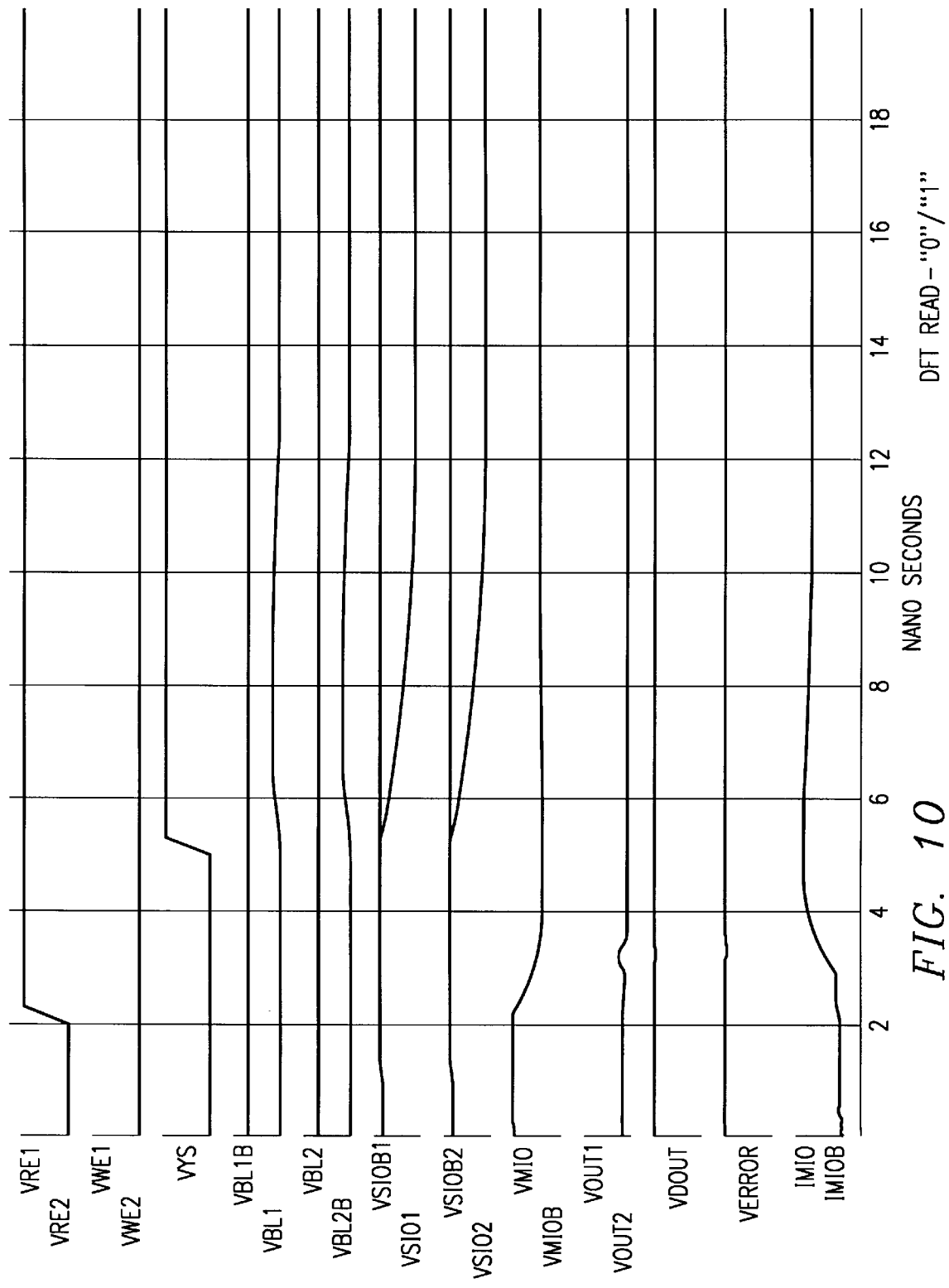
FIG. 10 is a timing diagram of one embodiment of current-mode data compression test mode operation with a "zero" in a first sense amplifier and a "one" in a second sense amplifier.
Figure 11:
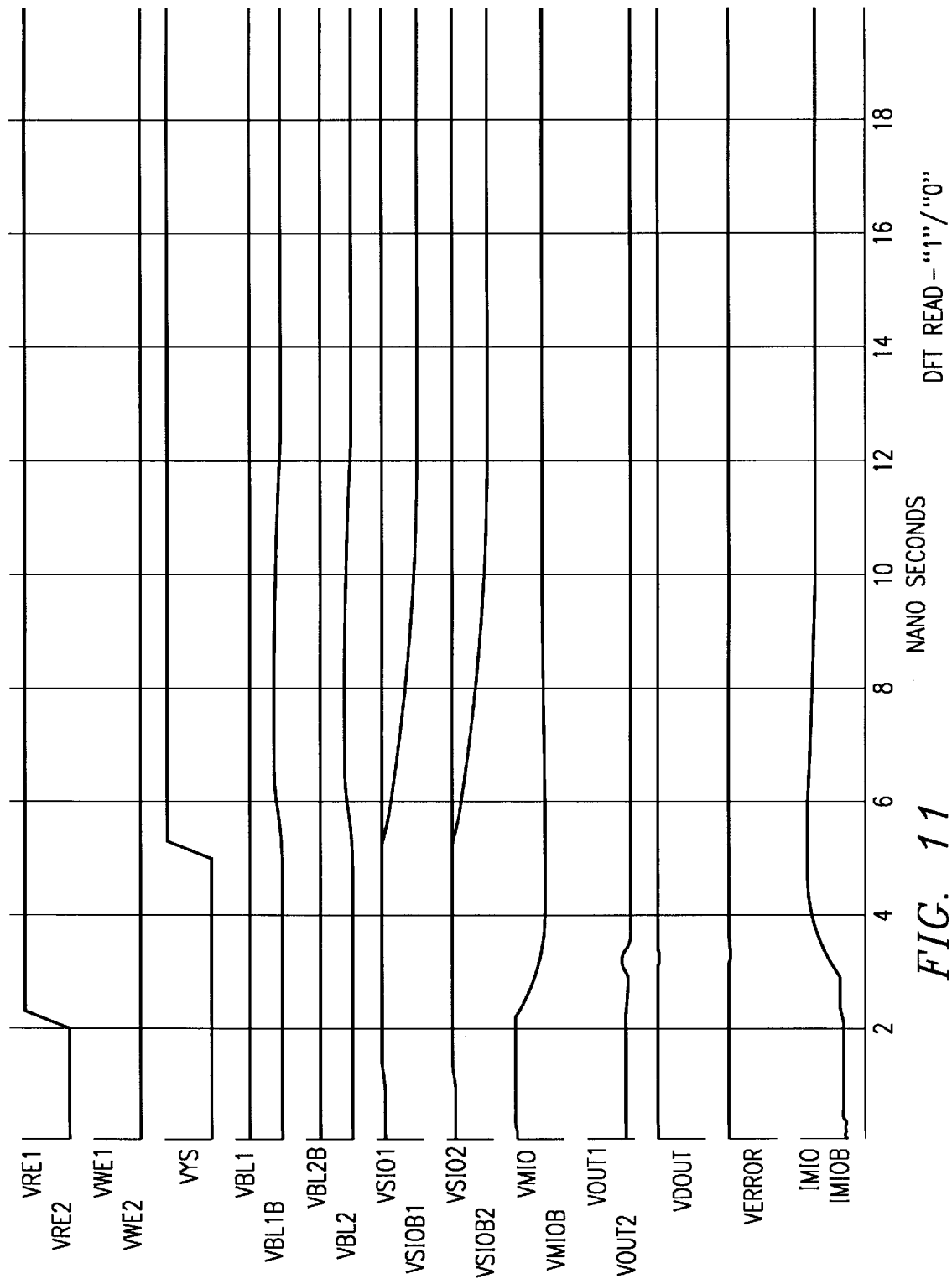
FIG. 11 is a timing diagram of one embodiment of current-mode data compression test mode operation with a "one" in a first sense amplifier and a "zero" in a second sense amplifier.

FIG. 10 is a timing diagram of one embodiment of current-mode data compression test mode operation with a "zero" in a first sense amplifier and a "one" in a second sense amplifier, and FIG. 11 is a timing diagram of one embodiment of current-mode data compression test mode operation with a "one" in a first sense amplifier and a "zero" in a second sense amplifier. Again, FIGS. 10 and 11 show the same set of signals. However, in FIGS. 10 and 11, the two memory cells being tested hold different data states, thus an error is indicated by error signal, VERROR.

Figure 12:
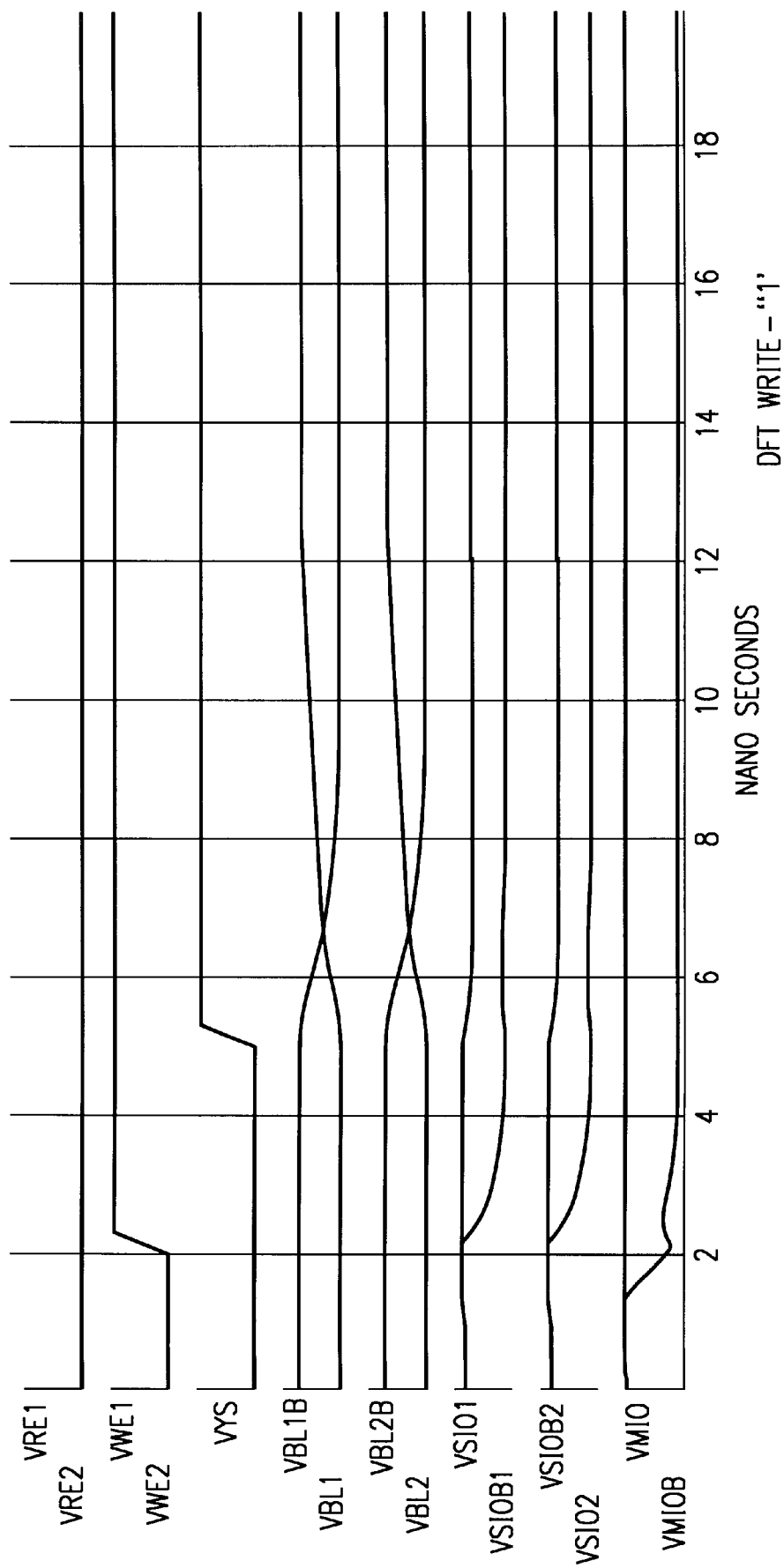
FIG. 12 is a timing diagram of one embodiment of current-mode data compression test mode write operation.

FIG. 12 is a timing diagram of one embodiment of current-mode data compression test mode write operation. FIG. 12 shows the same set of signals in the situation where data is being written to the memory cells connected to two sense amplifiers. The same data can be written to the cells accessed by two word lines, and then those cells can be tested as discussed above. The current-mode data compression test scheme provided herein allows for a multiple reduction in the number of row addresses that need to be accessed in order to test an entire memory array. In addition, this test mode can be implemented on a memory device without changing the architecture or layout of the memory array in the memory device.

Although the present invention has been described in detail, it should be understood that various changes, substitutions and alterations can be made thereto without departing from the spirit and scope of the invention as defined by the appended claims.

What is claimed is:

1. An integrated circuit memory device, comprising:

a memory array having a plurality of sub-arrays of memory cells, the memory cells selected for read operations by Y-select lines and word lines, and selected memory cells coupled to main amplifier circuits via bit lines, sense amplifiers, sub input/output lines, sub-amplifier circuits, and main input/output lines;

each main amplifier circuit operable:

during a normal read operation, to provide a data output representing a data state of a selected memory cell; and during a test mode read operation, to provide a data output representing a data state of a plurality of selected memory cells if the plurality of selected memory cells have the same data, and to provide an error signal if the plurality of selected memory cells have the different data states; and the test mode read operation characterized by activating a Y-select line and a plurality of word lines to select a plurality of memory cells that are coupled to different sub-amplifier circuits that feed the same main amplifier circuit; and each main amplifier circuit comprising:

a current mirror amplifier circuit operable to provide an output, wherein the output comprises two voltage signals so that, during test mode operation, the output has a first state if the plurality of selected memory cells have different data states, a second state if the plurality of selected memory cells have a data state of "one"; and a third state if the plurality of selected memory cells have a data state of "zero"; and output logic coupled to receive the output of the current mirror amplifier, the output logic operable to signal an error in response to the first state, to signal a data output of "one" in response to the second state, and to signal a data output of "zero" in response to the third state.

2. The integrated circuit memory device of claim 1, wherein the plurality of selected memory cells is two memory cells.

3. The integrated circuit memory device of claim 1, wherein the output logic comprises an inverter and a NOR gate.

4. The integrated circuit memory device of claim 1, wherein the output logic comprises an inverter and a NAND gate.

5. The integrated circuit memory device of claim 1, wherein the integrated circuit memory device is a DRAM device.

6. An integrated circuit memory device, comprising:

a memory array having a plurality of sub-arrays of memory cells, the memory cells selected for read operations by Y-select lines and word lines, and selected memory cells coupled to main amplifier circuits via sense amplifiers, sub-input/output lines, sub-amplifier circuits, and main input/output lines;

each main amplifier circuit operable:

during a normal read operation, to provide a data output representing a data state of a selected memory cell; and during a test mode read operation, to provide a data output representing a data state of a plurality of selected memory cells if the plurality of selected memory cells have the same data state, and to provide an error signal if the plurality of selected memory cells have different data states;

the test mode read operation characterized by activating a Y-select line and a plurality of word lines to select a plurality of memory cells that are coupled to different sub-amplifier circuits that feed the same main amplifier circuit; and each main amplifier circuit comprising:

a current mirror amplifier circuit operable to provide an output, where, during test mode operation, the output has a first state if the plurality of selected memory cells have different data states, a second state if the plurality of selected memory cells have a data state of "one", and a third state if the plurality of selected memory cells have a data state of "zero"; and output logic coupled to receive the output of the current mirror amplifier, the output logic operable to signal an error in response to the first state, to signal a data output of "one" in response to the second state, and to signal a data output of "zero" in response to the third state.

7. The integrated circuit memory device of claim 6, wherein the plurality of selected memory cells is two memory cells.

8. The integrated circuit memory device of claim 7, wherein the output comprises two voltage signals, and the output logic comprises an inverter and a NOR gate.

9. The integrated circuit memory device of claim 7, wherein the output comprises two voltage signals, and the output logic comprises an inverter and a NAND gate.

10. The integrated circuit memory device of claim 6, wherein the integrated circuit memory device is a DRAM device.

11. A method for testing an integrating circuit memory device, comprising:

activating a Y-select line and a plurality of word lines to select a plurality of memory cells, the plurality of word lines activated such that the selected memory cells are coupled to different sub-amplifier circuits that feed the same main amplifier circuit;

producing, from each main amplifier circuit, a data output representing a data state of the selected memory cells if the selected memory cells have the same data state, and an error signal if the selected memory cells have different data states; and repeating activating and producing until all memory cells in the memory array of the memory device have been tested;

wherein producing the data output and the error signal comprises:

producing an output having a first state if the associated subset of selected memory cells have different data states, a second state if the associated subset of selected memory cells have a data of "one", and a third state if the associated subset of selected memory cells have a data state of "zero"; and producing error signal in response to the first state, a data output of "one" in response to the second state, and a data output of "zero" in response to the third state.

12. The method of claim 12, wherein the plurality of selected memory cells includes two memory cells.

13. The method of claim 12, wherein the integrated memory device is a DRAM memory device.

* * * * *